(12) United States Patent
Malshe et al.

(10) Patent No.: US 11,791,000 B2
(45) Date of Patent: Oct. 17, 2023

(54) VALID TRANSLATION UNIT COUNT-BASED MEMORY MANAGEMENT

(71) Applicant: Micron Technology, Inc., Boise, ID (US)

(72) Inventors: Ashutosh Malshe, Fremont, CA (US); Vamsi Pavan Rayaprolu, San Jose, CA (US); Kishore K. Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/859,926

(22) Filed: Jul. 7, 2022

(65) Prior Publication Data

US 2022/0343984 A1    Oct. 27, 2022

Related U.S. Application Data

(63) Continuation of application No. 17/196,629, filed on Mar. 9, 2021, now Pat. No. 11,404,133.

(51) Int. Cl.
*G06F 12/02* (2006.01)
*G11C 16/34* (2006.01)
(Continued)

(52) U.S. Cl.
CPC ...... *G11C 16/3445* (2013.01); *G06F 12/0246* (2013.01); *G06F 12/0253* (2013.01);
(Continued)

(58) Field of Classification Search
CPC ..... G11C 16/3445; G11C 16/16; G11C 16/26; G11C 16/32; G11C 16/3495;
(Continued)

(56) References Cited

U.S. PATENT DOCUMENTS

| 11,086,537 B2 | 8/2021 | Byun |
| 2014/0231954 A1 | 8/2014 | Lue |

(Continued)

FOREIGN PATENT DOCUMENTS

WO    2017074570 A1    5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

(Continued)

*Primary Examiner* — Jay W. Radke
(74) *Attorney, Agent, or Firm* — Brooks, Cameron & Huebsch, PLLC

(57) ABSTRACT

A method includes determining a first valid translation unit count (VTC) for a first block of memory cells, determining a second VTC for a second block of memory cells when the first VTC is below a VTC threshold corresponding to performance of a memory management operation, consolidating the first VTC and the second VTC when the consolidated first VTC and the second VTC equal or exceed the VTC threshold corresponding to the performance of the memory management operation, and executing the memory management operation utilizing the consolidated first VTC and the second VTC.

19 Claims, 8 Drawing Sheets

(51) Int. Cl.
*G11C 16/32* (2006.01)
*G11C 16/26* (2006.01)
*G11C 16/16* (2006.01)

(52) U.S. Cl.
CPC .............. *G11C 16/16* (2013.01); *G11C 16/26* (2013.01); *G11C 16/32* (2013.01); *G11C 16/3495* (2013.01); *G06F 2212/7202* (2013.01)

(58) Field of Classification Search
CPC ............. G06F 12/0246; G06F 12/0253; G06F 2212/7202; G06F 2212/1016; G06F 2212/1036; G06F 2212/7205; G06F 2212/7211
See application file for complete search history.

(56) References Cited

U.S. PATENT DOCUMENTS

| | | | |
|---|---|---|---|
| 2016/0139812 A1* | 5/2016 | Zhang | G06F 3/0616 |
| | | | 711/103 |
| 2016/0163381 A1* | 6/2016 | Lee | G06F 12/1036 |
| | | | 711/209 |
| 2016/0179386 A1 | 6/2016 | Zhang | |
| 2020/0073798 A1 | 3/2020 | Cho | |
| 2021/0224187 A1 | 7/2021 | Um | |

OTHER PUBLICATIONS

U.S. Appl. No. 16/739,983 entitled, "Performing a Media Management Operation Based on a Sequence Identifier for a Block", filed Jan. 10, 2020, 56 pages.

* cited by examiner

DATA BLOCK 410

| V | V | V |
|---|---|---|
| V | V | V |
| V | V | X |

DATA BLOCK 412

| V | V | V |
|---|---|---|
| V | V | X |
| X | X | X |

DATA BLOCK 414

| V | V | V |
|---|---|---|
| V | V | V |
| X | X | X |

DATA BLOCK 420

|   |   |   |
|---|---|---|
|   |   |   |
|   |   |   |

DATA BLOCK 422

|   |   |   |
|---|---|---|
|   |   |   |
|   |   |   |

*FIG. 4A*

DATA BLOCK 410

|   |   |   |
|---|---|---|
|   |   |   |
|   |   |   |

DATA BLOCK 412

| V | V | V |
|---|---|---|
| V | V | X |
| X | X | X |

DATA BLOCK 414

| V | V | V |
|---|---|---|
| V | V | V |
| X | X | X |

DATA BLOCK 420

| V |   |   |
|---|---|---|
| V | V | V |
| V | V | V |

DATA BLOCK 422

|   |   |   |
|---|---|---|
|   |   |   |
|   |   |   |

*FIG. 4B*

DATA BLOCK 410

DATA BLOCK 412

DATA BLOCK 414

| V | V | V |
|---|---|---|
| V | V | V |
| X | X | X |

DATA BLOCK 420

| V | V | V |
|---|---|---|
| V | V | V |
| V | V | V |

DATA BLOCK 422

| | | |
|---|---|---|
| | | |
| V | V | V |

*FIG. 4C*

DATA BLOCK 410

DATA BLOCK 412

DATA BLOCK 414

DATA BLOCK 420

| V | V | V |
|---|---|---|
| V | V | V |
| V | V | V |

DATA BLOCK 422

| V | V | V |
|---|---|---|
| V | V | V |
| V | V | V |

*FIG. 4D*

VALID TRANSLATION UNIT COUNT-BASED MEMORY MANAGEMENT

PRIORITY INFORMATION

This application is a Continuation of U.S. application Ser. No. 17/196,629, filed Mar. 9, 2021, the contents of which are included herein by reference.

TECHNICAL FIELD

Embodiments of the disclosure relate generally to memory sub-systems, and more specifically, relate to valid translation unit count-based memory management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 4A-4D illustrate an example series of operations to consolidate valid data from blocks in accordance with some embodiments of the present disclosure.

DETAILED DESCRIPTION

Figure 1:
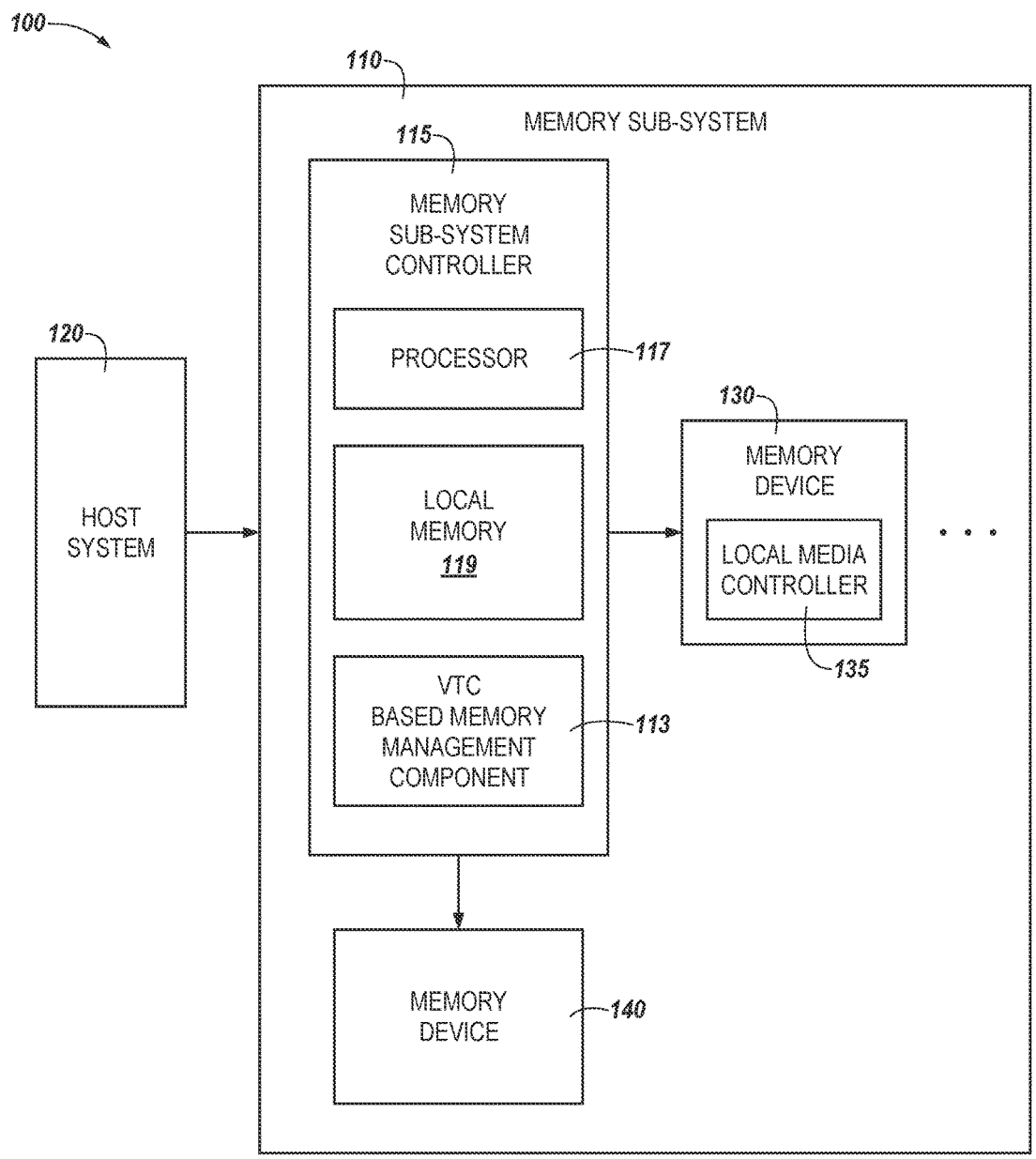
FIG. 1 illustrates an example computing system that includes a memory sub-system in accordance with some embodiments of the present disclosure.

Aspects of the present disclosure are directed to valid translation unit count (VTC)-based memory management, in particular to memory sub-systems that include a VTC-based memory management component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. In one embodiment, a plurality of memory components can be arranged to form a stackable cross-gridded array of a plurality of superblocks comprising a plurality of interleaved NAND memory cells.

Memory cells (e.g., non-volatile memory cells) can be grouped as pages that can refer to a logical unit of the memory device used to store data. With some types of memory (e.g., flash memory, such as a NAND memory device, etc.), pages can be grouped to form memory blocks. Media management operations can be performed on the memory blocks. Non-limiting examples of media management operations can include error correction operations, wear leveling operations, write disturb mitigation operations, and/or garbage collection operations. Media management operations can be performed in the "foreground" (e.g., during a time when a host is utilizing an interface associated with the memory sub-system and/or in the "background" (e.g., when the host is not utilizing the interface associated with the memory sub-system).

A "garbage collection operation" generally refers to a process of folding data from a victim block stripe into a new destination block stripe, with the intended purpose of data consolidation to free up memory resources for subsequent program/erase cycles. As used herein, a "block stripe" generally refers to a logical grouping of memory blocks that share a same upper block number and can be accessed in parallel. However, the garbage collection operation can utilize read and write operations that result in write amplification, which can increase memory sub-system (e.g., SSD) power consumption and can decrease the lifespan of the memory sub-system, for example, since the memory cells can become unusable after experiencing a certain number of program/erase cycles. "Folding" is the migration of data from one memory device location (e.g., NAND location) to another memory device (e.g., NAND location) location independent of any direct host interaction. Folding can be performed to pack valid data together, for example, as part of garbage collection operations, which can then free more memory device storage space for operations (e.g., new writes, error avoidance operations, wear leveling operations, restoring RAIN parity protection in the event of an error).

Additionally, efficiency of the media management operation can vary based on a type of media management operation (e.g., a foreground or background media management operation such as a garbage collection operation) to be performed on the source memory block. Thus, by not accounting for the quantity of valid data to be utilized and/or a type of media management operation invoked, the memory sub-system can experience degraded performance with approaches that use VTC as a sole criterion for source block selection. This degradation of performance can be undesirable, especially in critical applications and/or in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Some approaches to media management can include utilization of "bins" and "binning indices" that seek to classify data based on the age of the data stored within a memory sub-system in order to attempt to minimize charge loss in memory devices. As is understood, charge loss (e.g., voltage drift) associated with memory cells can affect data stored in the memory cells, an issue that can become further compounded over time. Such approaches can employ memory modules that identify memory blocks with a highest bin index (e.g., memory blocks having an age beyond a certain threshold age or memory blocks storing data beyond a certain threshold age) and perform forced folding operations in which all of the data in a given block is folded regardless of validity based on identification of blocks having the highest bin index (or those blocks having the highest bin indices). Some approaches that utilize such techniques can further classify portions of the data (e.g., portions of valid data) as "hot," "pseudo-cold," or "cold" data based on the age of the data (e.g., based on the bin index corresponding to the blocks and/or data stored in the blocks) and perform forced folding operations based on such classifications. However, such approaches can incur inefficiencies by failing to account for the validity of data contained in the blocks, as well as other media management criteria.

Aspects of the present disclosure address the above and other deficiencies by determining a first valid translation unit count (VTC) for a first block of memory cells. For example, a quantity of valid data can be determined for a first candidate block. In some examples, a VTC based memory management component can determine a second VTC for a second block of memory cells when the first VTC is below a VTC threshold corresponding to performance of a memory management operation. In these examples, the first VTC and the second VTC are consolidated when the consolidated first VTC and the second VTC equal or exceed the VTC threshold corresponding to the performance of the memory management operation. Once the first VTC is consolidated with the second VTC, the memory management operation can be executed utilizing the consolidated first VTC and the second VTC.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a VTC-based memory management component 113. Although not shown in FIG. 1 so as to not obfuscate the drawings, the VTC-based memory management component 113 can include various circuitry to facilitate determining respective dispersions of valid data portions within blocks, selecting a memory block based at least on the respective dispersions, and performing a media management operation on the selected memory block. In some embodiments, the VTC-based memory management component 113 can include special purpose circuitry in the form of an ASIC, FPGA, state machine, and/or other logic circuitry that can allow the VTC-based memory management component 113 to orchestrate and/or perform operations to selectively perform media management operations for the memory device 130 and/or the memory device 140 based at least on the quantity of the valid data portions to be utilized by the media management operation.

In some embodiments, the memory sub-system controller 115 includes at least a portion of the VTC-based memory management component 113. For example, the memory sub-system controller 115 can include a processor 117 (processing device) configured to execute instructions stored in local memory 119 for performing the operations described herein. In some embodiments, the VTC-based memory management component 113 is part of the memory sub-system 110, an application, or an operating system.

In a non-limiting example, an apparatus (e.g., the computing system 100) can include a memory sub-system VTC-based memory management component 113. The memory sub-system VTC-based memory management component 113 can be resident on the memory sub-system 110. As used herein, the term "resident on" refers to something that is physically located on a particular component. For example, the memory sub-system VTC-based memory management component 113 being "resident on" the memory sub-system 110 refers to a condition in which the hardware circuitry that comprises the memory sub-system VTC-based memory management component 113 is physically located on the memory sub-system 110. The term "resident on" may be used interchangeably with other terms such as "deployed on" or "located on," herein.

The memory sub-system VTC-based memory management component 113 can be configured to determine a first valid translation unit count (VTC) for a first block of memory cells. As described herein, the first VTC for a first block of memory cells includes a quantity of valid data for a candidate block (e.g., first block of memory cells, etc.). As used herein, the term "candidate block" generally refers to a block of memory to be utilized for a memory management operation. The first block of memory cells corresponds to a candidate block of memory cells that correspond to a first type of memory management operation. For example, the first block of memory cells can correspond to a candidate block for a time after programming (TAP) fold operation (or, for brevity, a "TAP fold,"). In another example, the first block of memory cells can correspond to a candidate block for a static wear leveling (SWL) fold operation (or, for brevity, a "SWL fold,"). In another examples, the first block of memory cells can correspond to a candidate block for a reliability (REL) fold operation (or, for brevity, a "REL fold,"). Although specific examples of folding are provided, the present disclosure is not so limited. For example, other types of memory management operations can utilize candidate blocks in a similar way.

A TAP fold operation can include folding operations that are triggered due to degraded media integrity of data in the block owing to the charge loss associated with the amount of time elapsed after the block was programmed. For example, voltage drift with respect to one or more memory cells can occur based on the amount of time that the data is stored in the media (e.g., in a block of memory cells). In contrast, a REL fold can include folding operations that are triggered when the media integrity of data in the block has degraded due to block usage and access stresses. Block usage can include, but is not limited to: memory reads, memory cycling, memory read disturbs (e.g., read operation performed on one row of cells impacts a threshold voltage of unread cells).

The memory sub-system VTC-based memory management component 113 can be configured to determine a second VTC for a second block of memory cells when the first VTC is below a VTC threshold corresponding to performance of a memory management operation. As described herein, a second VTC for a second block of memory cells can be determined based on a block size of the second block. In at least one embodiment, the VTC threshold can be calculated by multiplying a block size (SB) with a tunable value (Y) to determine when there is enough valid data to be folded into a destination block. As used herein, the term "tunable value" generally refers to a numerical parameter (e.g., value) that can be altered based on characteristics of the block size, as described herein. In some embodiments, the tunable value can be a value that is between 1 and 2. That is, the VTC threshold can be based on the block size and a tunable value that can be tunable based on a type of the second block of memory cells. In some embodiments, the second VTC can be determined for a second block of memory cells that is different than the first block of memory cells. For example, the first block of memory cells can correspond to a candidate block for a TAP fold and the second block of memory cells can correspond to a candidate block for a SWL fold. That is, the second block of memory cells is a block of memory cells that, prior to consolidation of the first VTC, were a candidate for a different type of memory management operation.

As used herein, a "threshold," such as a VTC threshold, generally refers to a designated quantity of valid translation units to provide an efficient memory management operation. In some embodiments, the VTC threshold is based on characteristics associated with the destination block on which the memory management operation is performed. For example, the characteristics associated with the destination block can include a quantity of free or open memory cells within the destination block. That is, the VTC threshold can be based on a quantity of memory cells associated with a destination block. For example, the VTC threshold can be based on a quantity of memory cells of a destination block for the memory management operation. In this example, the VTC threshold can be utilized to more efficiently perform the memory management operation in comparison to approaches that rely on do not account for the VTC thresholds described herein. That is, the VTC threshold can be utilized to ensure that the destination block is substantially filled or completely filled with valid data from the candidate block or candidate blocks.

The memory sub-system VTC-based memory management component 113 can be configured to consolidate the first VTC and the second VTC when the consolidated first VTC and the second VTC equal or exceed the VTC threshold corresponding to the performance of the memory management operation. As used herein, the term "consolidating" or "combining" generally refers to grouping VTC for different memory management operation candidate blocks for a particular memory management operation. Consolidating the first VTC and the second VTC includes combining or utilizing both of the first VTC and the second VTC as a single collection of VTC to be utilized to perform the memory management operation. As described herein, the first VTC can correspond to a first candidate block of a first memory management operation and the second VTC can correspond to a second candidate block of a second memory management operation. By combining the first VTC and the second VTC into a single destination block, the combined VTC can be utilized for the memory management operation and the single destination block for the first VTC and second VTC can fill or substantially fill the single destination block with valid data. In this way, relatively cold candidate blocks can be consolidated into fewer destination blocks, which can reduce garbage collection inefficiency inherent in some approaches. The term "cold," as used herein, generally refers to data or a block containing data that has not been accessed for a long duration relative to other data accessed from a memory sub-system or memory device. Conversely, the term "hot," as used herein, generally refers to data or a block containing data that has been accessed frequently relative to other data accessed from a memory sub-system or memory device. Terms such as "pseudo-cold" generally refer to data or a block containing data that has been accessed less frequently than "hot" data but more frequently than "cold" data.

The memory sub-system VTC-based memory management component 113 can be configured to execute the memory management operation utilizing the consolidated first VTC and the second VTC. Executing the memory management operation utilizing the consolidated first VTC and the second VTC can include performing the memory management operation, such as a folding operation, on the first VTC and second VTC as a single source of valid data. In this way, the destination block of the memory management operation will be filled or substantially filled with the valid data, which can reduce cold data from being re-circulated into blocks with hot data, which can increase the quantity of memory management operations that are performed.

Figure 2:
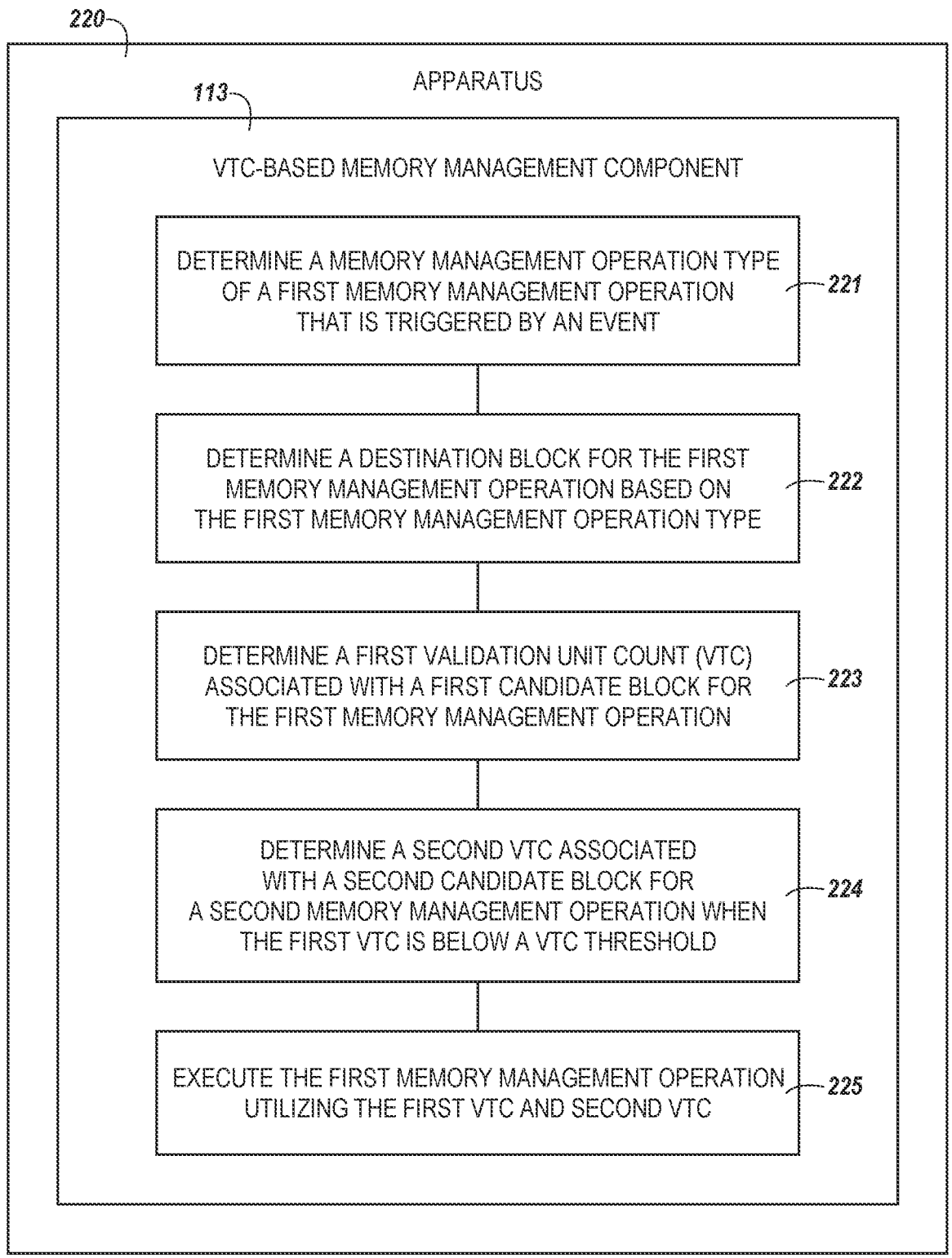
FIG. 2 illustrates an example apparatus that includes a VTC-based memory management component in accordance with some embodiments of the present disclosure.

FIG. 2 illustrates an example apparatus 220 that includes a VTC-based memory management component 113 in accordance with some embodiments of the present disclosure. The apparatus 220 represents a device or portion of a device that can be utilized to perform VTC-based memory management as described herein. In some embodiments, the apparatus 220 can be a component of a system, such as the computing system 100 referenced in FIG. 1. For example, the apparatus 220 illustrated in FIG. 2 includes a VTC-based memory management component 113 that is utilized in a similar way as illustrated in FIG. 1.

At operation 221, the VTC-based memory management component 113 can be configured to determine a memory management operation type of a first memory management operation that is triggered by an event. As used herein, a "memory management operation type" generally refers to a categorization of a memory management operation. In some embodiments, memory management operations can be categorized based on the function that is performed, the candidate block, the destination block, and/or purpose of the corresponding memory management operation. In some embodiments, identifying a type of the memory management operation is based, at least in part, on a determination that an event that triggers the memory management operation has occurred. As described herein, a memory management operation can be triggered by an event or by a particular module of a computing system. For example, a folding memory management operation can be triggered by a garbage collection event. Since different memory management operations can be triggered by different modules of the computing system, the efficiency of the memory management operations can suffer due to duplicate memory management operations or multiple memory management operations being performed on the same data or same blocks.

In some embodiments, determining the memory management operation type includes identifying that the memory management operation has been initiated in response to the event. In such embodiments, the type of the memory management operation can be identified based on properties of the memory management operation. For example, the type of memory management operation can be identified based on the event, the candidate block, and/or the destination block, among others. In other embodiments, identifying the type of memory management operation includes determining whether the memory management operation is a reliability fold, a TAP fold, or a SWL fold. In these examples, the VTC-based memory management component 113 determines the type of fold, type of candidate blocks, and/or type of destination blocks for the memory management operation.

At operation 222, the VTC-based memory management component 113 can be configured to determine a destination block for the first memory management operation based on the first memory management operation type. As used herein, a "destination block" generally refers to a block to be utilized to transfer valid data to during a memory management operation. In some embodiments, determining a destination block on which the memory management operation is performed is based, at least in part, on the determined type of the memory management operation. In some embodiments, the type of memory management operation can correspond to a particular type of destination block. For example, the destination block can have a relatively low erase cycles (EC) rate when the type of memory management operation is a reliability fold. In this example, the destination block can have a relatively high EC rate when the type of memory management operation is a TAP fold and/or SWL fold. In this way, the reliability fold can correspond to a type of destination block with a relatively low EC and the TAP fold and SWL fold can correspond to a type of destination block with a relatively high EC. As used herein, an "erase cycle rate" or "program erase cycle rate" generally refers to a quantity of erase cycles performed on a memory cell or portion of memory cells over a period of time. For example, a high EC rate for a first block of memory cells can indicate that the first block of memory cells has had a relatively high quantity of erase cycles performed over a period of time. In a similar example, a low EC rate for a second block of memory cells can indicate that the second block of memory cells has had a relatively low quantity of erase cycles performed over the period of time.

At operation 223, the VTC-based memory management component 113 can be configured to determine a first valid translation unit count (VTC) associated with a first candidate block for the first memory management operation. As described herein, the first VTC associated with the first candidate block includes a quantity of valid data associated with the first candidate block. As described herein, the first candidate block can correspond to a block of memory cells to be utilized for the first memory management operation.

At operation 224, the VTC-based memory management component 113 can be configured to determine a second VTC associated with a second candidate block for a second memory management operation when the first VTC is below a VTC threshold. As described herein, the second memory management operation can be different than the first memory management operation and the second VTC can correspond to the quantity of valid data for a candidate block that corresponds to the second memory management operation. As described herein, the first VTC can be compared to a VTC threshold value to determine whether performing the memory management operation will be an efficient memory management operation. As used herein, an "efficient memory management operation" generally refers to a memory management operation that fills or substantially fills a destination block with valid data. For example, an efficient memory management operation includes a memory management operation that does not result in a subsequent memory management operation to alter a state of the data or blocks that were not altered by the first memory management operation. Thus, consolidating the first VTC with the second VTC when the first VTC is below the VTC threshold can ensure that the memory management operation is performed at a relatively high level of efficiency and that the destination block is filled or substantially filled with valid data. In some embodiments, the VTC-based memory management component 113 can be configured to execute the first memory management operation utilizing only the first VTC when the first VTC exceeds the threshold VTC.

At operation 225, the VTC-based memory management component 113 can be configured to execute the first memory management operation utilizing the first VTC and second VTC. As described herein, the first memory management operation can be executed utilizing the first VTC and the second VTC as a single quantity of data. Thus, the first VTC and the second VTC can be folded into a particular destination block. In these embodiments, the particular destination block can be utilized based on the type of the first memory management operation.

Figure 3:
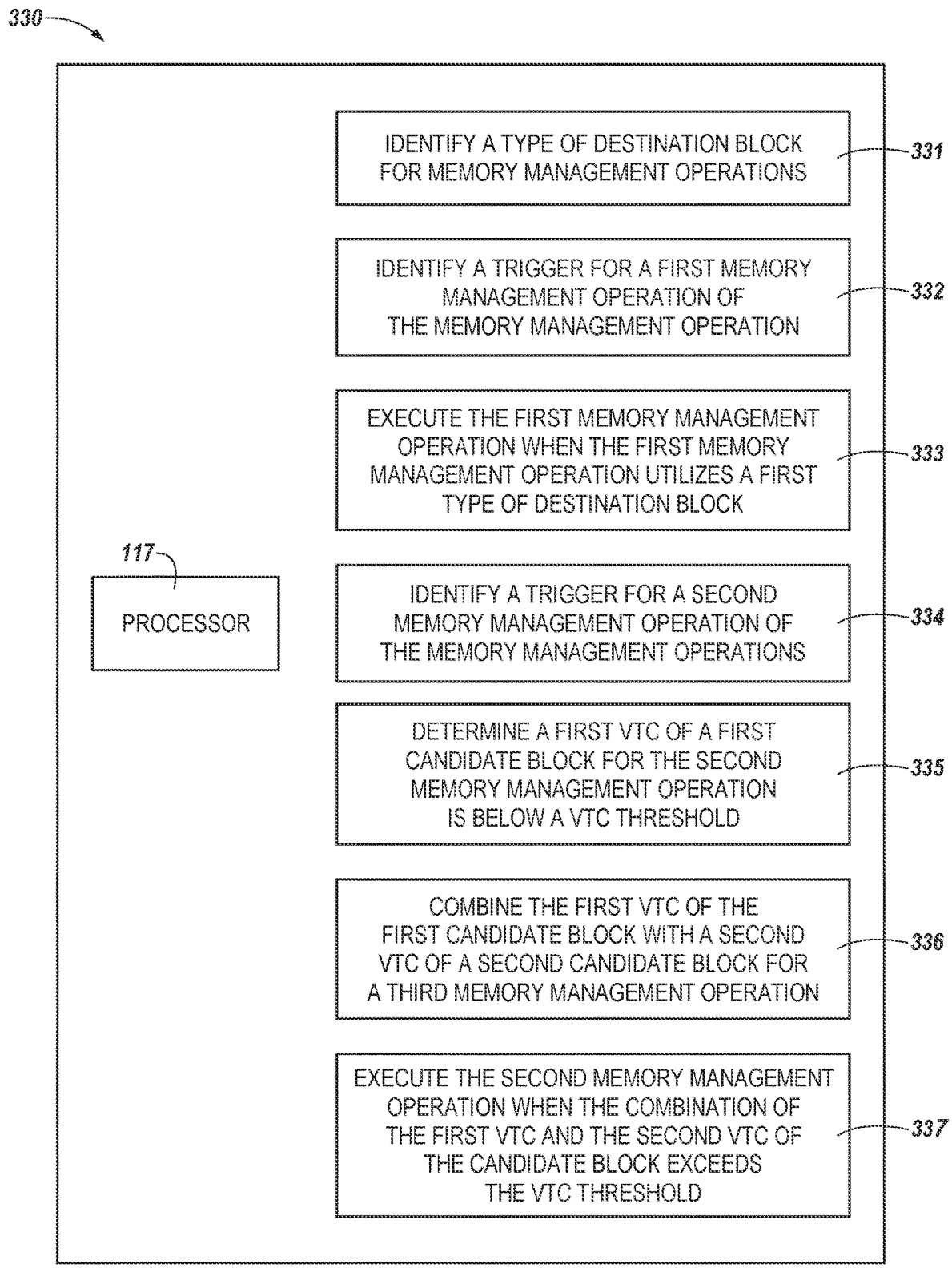
FIG. 3 illustrates an example computing system that includes a processor in accordance with some embodiments of the present disclosure.

FIG. 3 illustrates an example computing system 330 that includes a processor 117 in accordance with some embodiments of the present disclosure. In some embodiments, the computing system 330 can include the same or similar elements as computing system 100 as referenced in FIG. 1. For example, the system 330 includes a processor 117 to execute instructions. Blocks 331, 332, 333, 334, 335, 336, 337 illustrate instructions that can be executed by the processor 117 to allow the processor 117 to perform corresponding functions.

At operation 331, the processor 117 can be configured to identify a type of destination block for one or more memory management operations. As used herein, a "type of destination block" generally refers to a destination block with particular properties. For example, a type of destination block can refer to a property such as, but not limited to, a particular erase count rate. In some embodiments, the type of destination block comprises an erase count rate that corresponds to a quantity of error correction operations that correct a quantity of erroneous bits over time.

In some embodiments, the processor 117 can be configured to identify a type of destination block for one or more different memory management operations, such that a particular type of memory management operation can be identified and a corresponding type of destination block can be utilized when performing the particular type of memory management operation. For example, a first type of folding operation can utilize a destination block that is characterized as having a relatively low erase count rate and a second type of folding operation can utilize a destination block that is characterized as having a relatively high erase count rate. As described herein, an erase count rate can include a quantity of erase cycles performed over a period of time. In some examples, a low erase count rate corresponds to a quantity of erase cycles over a period of time being below an erase count threshold and the high erase count rate corresponds to a quantity of erase cycles performed over a period of time being above the erase count threshold.

At operation 332, the processor 117 can be configured to identify a trigger for a first memory management operation. As used herein, a trigger generally refers to an event or determination of an event that has initiated the memory management operation. For example, the trigger can be an event or signal generated by a computing module such as a garbage collection module. In a specific example, the first memory management operation includes a reliability fold initiated by a garbage collection operation.

At operation 333, the processor 117 can be configured to execute the first memory management operation when the first memory management operation utilizes a first type of destination block. In some embodiments, the first memory management operation utilizes the first type of destination block, which can correspond to a destination block with a relatively low erase count rate. In these embodiments, the first memory management operation can be executed when it is determined that the destination block includes a relatively low error rate. In a specific example, the first memory management operation is a reliability fold and the first type of destination block includes a relatively low erase count rate. Thus, in some embodiments, the processor 117 can be configured to execute the first memory management operation when it is determined that the first memory management operation is a reliability fold.

At operation 334, the processor 117 can be configured to identify a trigger for a second memory management operation. In some embodiments, the trigger for a second memory management operation can be utilized to identify the type of the second memory management operation. In some embodiments, the second memory management operation can be different than the first memory management operation. For example, the first memory management operation can be a reliability folding operation and the second memory management operation can be a TAP fold. Thus, the first memory management operation can utilize a first type of destination block and the second memory management operation can utilize a second type of destination block that is different than the first type of destination block. In a specific example, the first type of destination block is characterized by a relatively low erase count rate and the second type of destination block is characterized by a relatively high erase count rate.

At operation 335, the processor 117 can be configured to determine a first VTC of a first candidate block for the second memory management operation is below a VTC threshold. As described herein, the processor 117 can be configured to determine the first VTC of a candidate block for the second memory management operation. For example, the second memory management operation can be a TAP fold operation and the first VTC can include a quantity of valid data on a candidate block for the TAP fold. In these examples, the processor 117 can determine that the first VTC is below a VTC threshold, which can be based on a destination block to be utilized for the TAP fold.

At operation 336, the processor 117 can be configured to combine the first VTC of the first candidate block with a second VTC of a second candidate block for a third memory management operation. As described herein, the first VTC for the first candidate block can be combined with a second VTC of a second candidate block for a different memory management operation. For example, the third memory management operation can be a SWL fold operation. In this example, the SWL fold operation can utilize the same destination block type as the TAP fold. In this way, the VTC of a candidate block for the TAP fold can be combined with VTC of a candidate block for a SWL fold. Thus, the first VTC of the first candidate block can be combined with the second VTC of the second candidate block to increase a quantity of VTC to be utilized by the memory management operation. In some embodiments, the processor 117 can be configured to tag data corresponding to the first VTC and the second VTC as cold data when executing the second memory management operation. In this way, the first VTC and the second VTC can be combined as a singular type of data to be utilized to execute the memory management operation.

At operation 337, the processor 117 can be configured to executing the second memory management operation when the combination of the first VTC and the second VTC of the candidate block exceeds the VTC threshold. In some embodiments, the second memory management operation utilizes a second type of destination block. As described herein, the second memory management operation can be executed utilizing the combination of the first VTC and the second VTC to increase the quantity of VTC utilized for the second management operation. In some embodiments, the processor 117 can be configured to execute a first memory management operation with the combination of the first VTC and the second VTC when the combination of the first VTC and the second VTC are below the VTC threshold. That is, the processor 117 can be configured to consolidate remnant valid data that can be utilized with a different destination block when the first VTC and the second VTC are below the VTC threshold.

FIGS. 4A-4D illustrate an example series of operations to consolidate valid data from blocks in accordance with some embodiments of the present disclosure. Referring to FIG. 4A, blocks 410, 412, and 414 each store some amount of valid data and invalid data where valid data is represented by "v" and invalid data is represented by "x". Blocks 420 and 422 can initially be empty, not storing any data. For example, blocks 420 and 422 could have been recently been garbage collected and/or erased. Each sub-block of the blocks 410, 412, 414, 420, and 422 can be a unit of storage (e.g., a word line, a page, etc.). FIG. 4A depicts the blocks prior to a garbage collection operation being performed on the blocks 410, 412, and 414.

Referring to FIG. 4B, block 410 has been garbage collected and the valid data that was stored at block 410 in FIG. 4A is now stored at block 420. As described herein, the memory management operation can transfer the valid data from block 410 to block 420 when the quantity of valid data exceeds a threshold value. Accordingly, the valid data from block 410 is copied to block 420, after which the data at block 410 is erased. The valid data copied from block 410 to block 420 is likely to be mostly cold data because the garbage collection operation was done based on the VTC exceeding the threshold VTC. Blocks 420 and 422 can each be designated as blocks to store cold data that is garbage collected so that cold data is consolidated in blocks 420 and 422. Referring to FIG. 4C, the valid data that was stored at block 412 in FIG. 4B has been copied into block 420 and block 422. Similar to FIG. 4B, a garbage collection operation performed on block 412 can copy the valid data of block 412 to the designated cold blocks 420 and 422 and erase the data at block 412. The valid data can be partially copied to block 420 and partially to block 422. As described herein, the valid data can be copied to block 420 and partially to block 422 when the VTC of the block 412 exceeds a threshold VTC. In some embodiments, the memory management operation can be performed when the VTC for blocks 410, 412, and 414 exceeds the VTC threshold.

Referring to FIG. 4D, the valid data from block 414 has been copied into block 422. All the valid data that was originally stored in blocks 410, 412, and 414 in FIG. 4A now resides in blocks 420 and 422. The cold valid data from the cold blocks is therefore consolidated into as few blocks as possible. Accordingly, the quantity of available blocks that can store subsequent data has increased by 50% from 2 full blocks to 3 full blocks. Each of the blocks 410, 412, and 414 has been garbage collected and the valid data consolidated into blocks 420 and 422. It should be noted that FIGS. 4A-4D are illustrative and should not be construed as limited to the operations depicted. Other operations can occur throughout each of the operations depicted (e.g., read and write operations). Additionally, each of the blocks depicted can be located anywhere in a memory subsystem and are not required to be proximate to one another.

Figure 5:
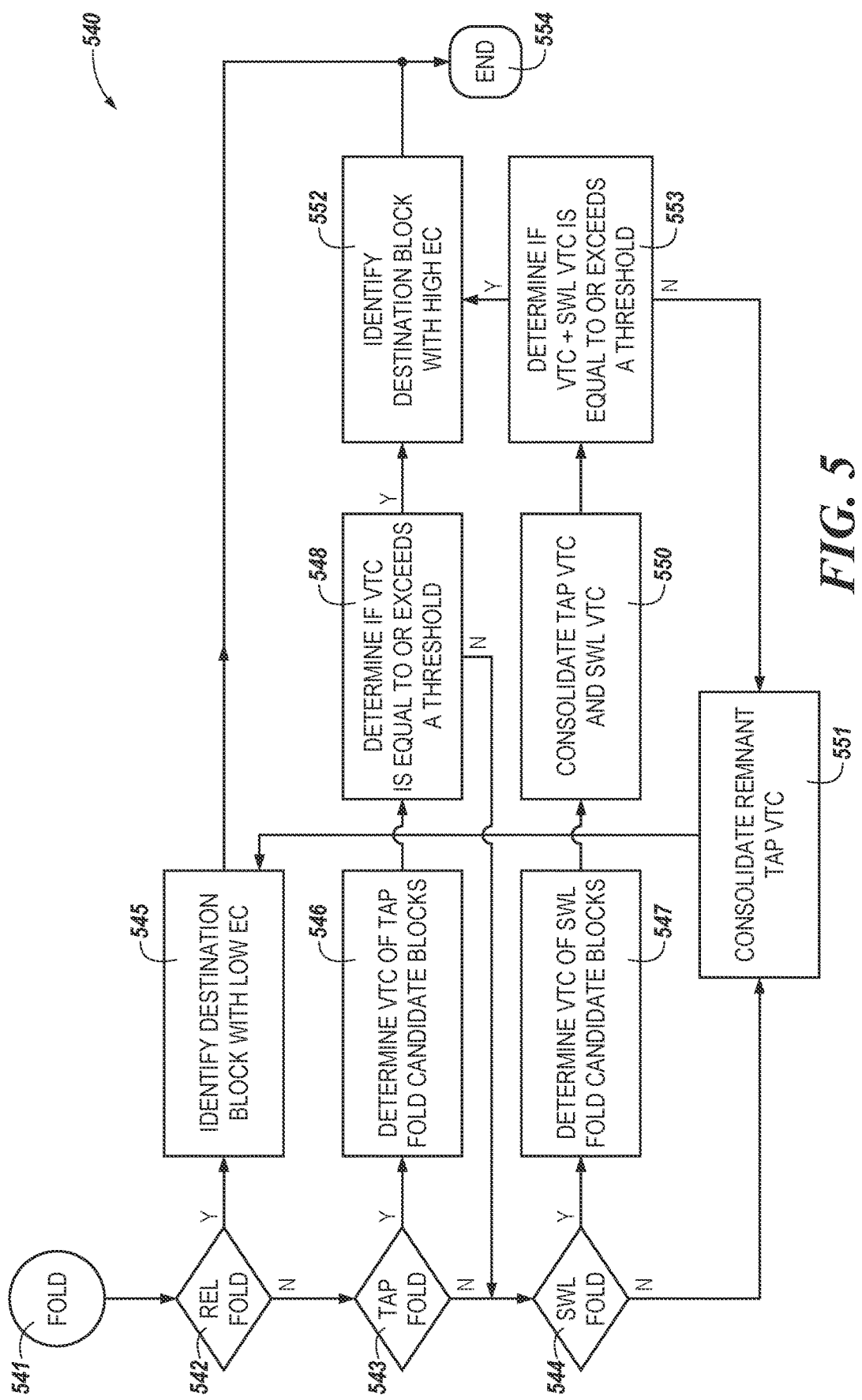
FIG. 5 is a flow diagram corresponding to valid translation unit count-based memory management in accordance with some embodiments of the present disclosure.

FIG. 5 is a flow 540 diagram corresponding to VTC-based memory management in accordance with some embodiments of the present disclosure. In some embodiments, the flow 540 can represent instructions that can be executed by a processor of a computing system. For example, the flow 540 can illustrate execution of a VTC-based memory management component 113 as illustrated in FIG. 1.

At operation 541, the flow 540 can receive an instruction that a memory management operation is to be performed. For example, the instruction can indicate that a folding operation is to be performed. In some embodiments, the flow 540 can identify that a particular memory management operation has been initiated by an event and initiates the flow 540 to determine the type of memory management operation that has been initiated and perform the particular memory management operation utilizing a selected destination block.

At operation 542, the flow 540 can determine if the memory management operation is a reliability fold. When the memory management operation is a reliability fold, the flow 540 can move to block 545. At operation 545, the flow 540 can identify a destination block with a low erase count rate (e.g., program erase count rate). As described herein, the flow 540 can identify the destination block with the low erase count rate based on the type of memory management operation (e.g., reliability fold, etc.).

When the memory management operation is not a reliability fold, the flow 540 can move to block 543. At operation 543, the flow 540 can determine if the memory management operation is a time after programming (TAP) fold. When the memory management operation is a TAP fold, the flow 540 can move to block 546. At operation 546, the flow 540 can determine the valid translation unit count of TAP fold candidate blocks. At operation 548, the flow 540 can determine if the VTC is equal to or exceeds a threshold (e.g., VTC threshold value, etc.). When the VTC of the TAP fold candidate blocks is equal to or exceeds the threshold, the flow 540 can move to block 552. As described herein, the threshold can be based on the space available within the destination block associated with the TAP fold. When the VTC of the TAP fold candidate blocks is less than the threshold, the flow 540 can move to block 544.

When the memory management operation is not a TAP fold at operation 543, the flow 540 can move to block 544. At operation 544, the flow 540 can determine if the memory management operation is a static wear leveling (SWL) fold. When the memory management operation is a SWL fold, the flow 540 can move to block 547. At operation 547, the flow 540 can determine a VTC of SWL fold candidate blocks. At operation 550, the flow 540 can consolidate the TAP VTC and SWL VTC. As described herein, consolidating the TAP VTC and the SWL VTC includes combining the valid data from the TAP candidate blocks and the valid data from the SWL candidate blocks to be utilized as a single source of valid data for the memory management operation to be performed.

At operation 553, the flow 540 can determine if the consolidated TAP VTC and SWL VTC is equal to or exceeds a threshold. When the consolidated TAP VTC and SWL VTC is equal to or exceeds a threshold, the flow 540 can move to block 552. When the consolidated TAP VTC and SWL VTC is less than the threshold, the flow 540 can move to block 551. At operation 551, the flow 540 can consolidate remnant TAP VTC and move to block 545. In this way, the flow 540 can include altering a destination block on which the memory management operation is performed when the consolidated first VTC and the second VTC is below the VTC threshold. In some embodiments, the flow 540 can consolidate remnant TAP VTC since the TAP VTC could need to be folded or could need to have a particular memory management operation performed. In this way, the consolidated remnant TAP VTC can be utilized to perform the memory management operation utilizing the destination block with a relatively low erase count rate at operation 545. In some embodiments, block 545 can execute the reliability fold utilizing the destination block with a relatively low erase count rate and block 552 can execute the TAP fold utilizing the destination block with a relatively high erase count rate. Once a memory management operation is performed, the flow 540 can move to block 554 to end the flow 540.

Figure 6:
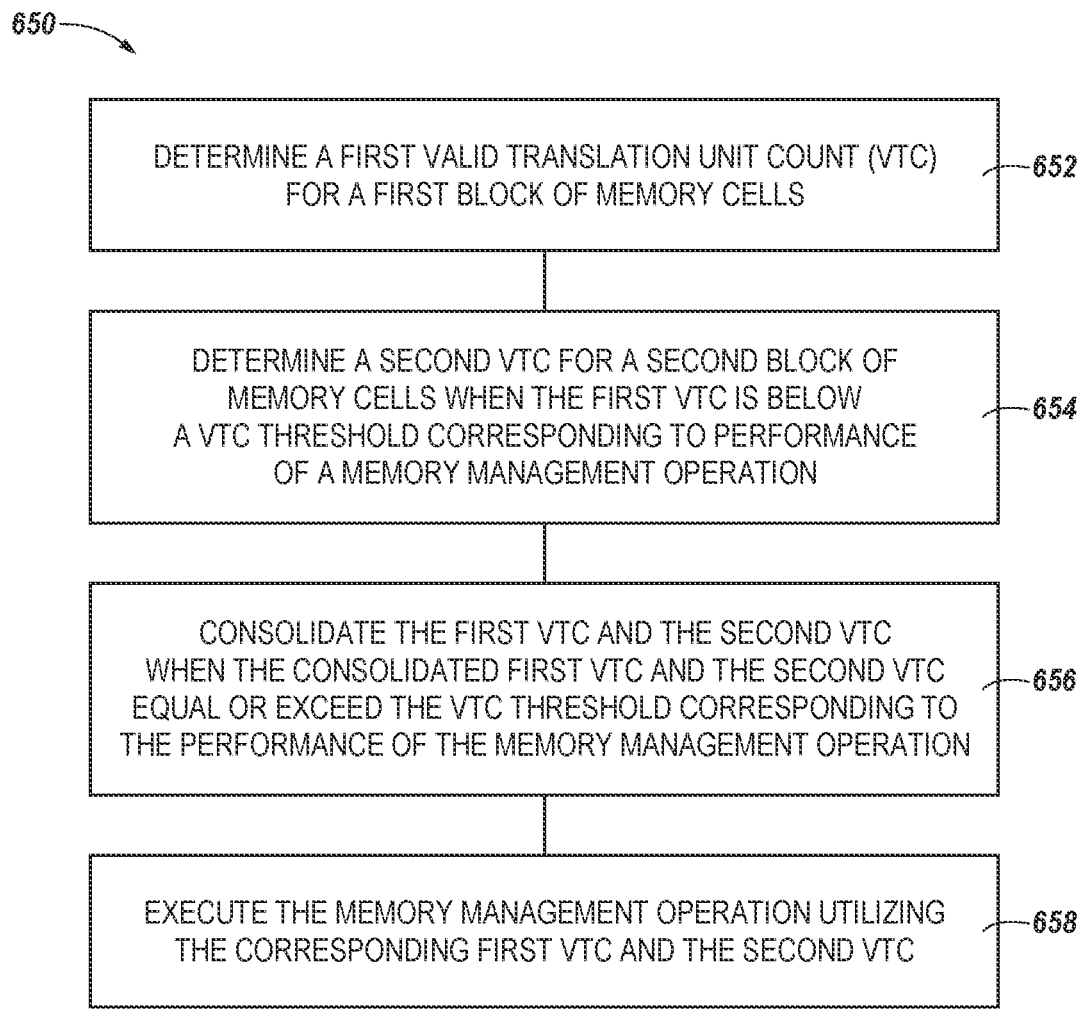
FIG. 6 is a flow diagram corresponding to a method for VTC-based memory management in accordance with some embodiments of the present disclosure.

FIG. 6 is a flow diagram corresponding to a method 650 for VTC-based memory management in accordance with some embodiments of the present disclosure. The method 650 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 650 is performed by the VTC-based memory management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 652, a first valid translation unit count (VTC) can be determined for a first block of memory cells. As described herein, the first block of memory cells can include a candidate block of memory cells to be utilized by a particular memory management operation. At block 654, the method 650 can include determining a second VTC for a second block of memory cells when the first VTC is below a VTC threshold corresponding to performance of a memory management operation. As described herein, the second block of memory cells can be different than the first block of memory cells. For example, the first block of memory cells can be a candidate block for a first memory management operation and the second block of memory cells can be a candidate block for a second memory management operation. In some embodiments, the second block of memory cells is a block of memory cells that, prior to consolidation of the first VTC, were a candidate for a different type of memory management operation.

At operation 656, the first VTC and the second VTC can be consolidated when the consolidated first VTC and the second VTC equal or exceed the VTC threshold corresponding to the performance of the memory management operation. That is, the first VTC can be combined with the second VTC to be utilized for the memory management operation. In some embodiments, the VTC threshold can be based on characteristics associated with the destination block on which the memory management operation is performed. For example, the VTC threshold can be based on a quantity of open memory cells of the destination block on which the memory management operation is performed.

At operation 658, the memory management operation can be executed utilizing the consolidated first VTC and the second VTC. The method 650 can further include altering a destination block on which the memory management operation is performed when the consolidated first VTC and the second VTC is below the VTC threshold. For example, the first VTC and the second VTC can be consolidated to be utilized by a first memory management operation with a first destination block. In this example, the consolidated first VTC and the second VTC can be utilized by a second memory management operation with a second destination block when the consolidated first VTC and the second VTC is below the VTC threshold.

In some embodiments, the method 650 can include identifying a type of the memory management operation based, at least in part, on a determination that an event that triggers the memory management operation has occurred and/or determining a destination block on which the memory management operation is performed based, at least in part, on the determined type of the memory management operation. As described herein, the event can include a signal from a computing module to initiate or execute the memory management operation. In some embodiments, the signal can be utilized to determine the type of memory management operation to be performed.

Figure 7:
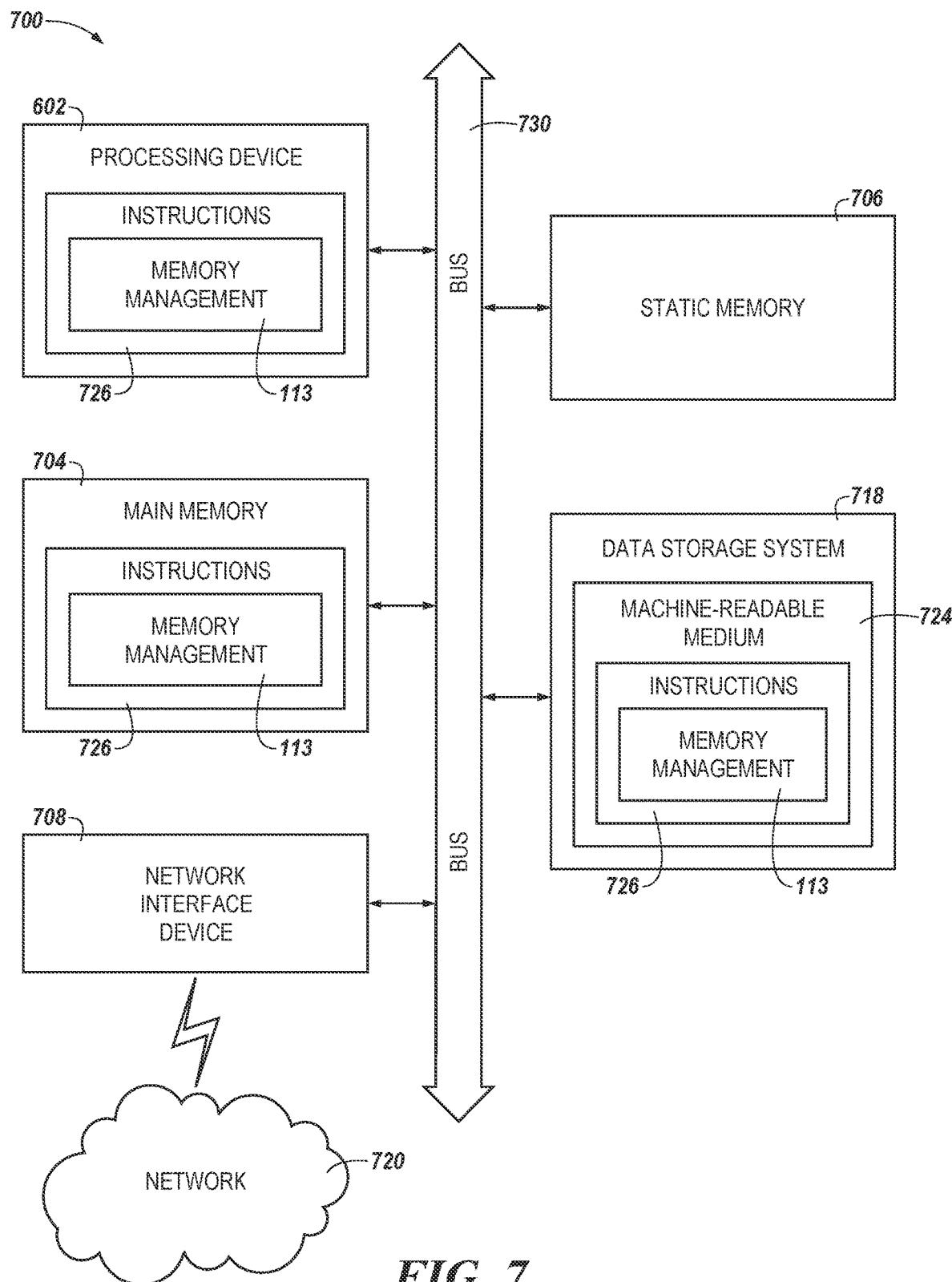
FIG. 7 is a block diagram of an example computer system in which embodiments of the present disclosure may operate.

FIG. 7 is a block diagram of an example computer system 700 in which embodiments of the present disclosure may operate. For example, FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the VTC-based memory management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a VTC-based memory management component (e.g., the VTC-based memory management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

What is claimed is:

1. A method, comprising:
    determining a valid translation count (VTC) for a first group of memory cells;
    determining a VTC for a second group of memory cells; and
    performing a memory management operation involving the first group of memory cells and the second group of memory cells in response to a consolidated VTC including the VTC for the first group of memory cells and the VTC for the second group of memory cells meeting a VTC criterion corresponding to performance of the memory management operation, wherein the VTC criterion corresponding to performance of the memory management operation is based on characteristics associated with a destination block on which the operation involving the first group of memory cells and the second group of memory cells is performed.

2. The method of claim 1, wherein:
    the VTC for the first group of memory cells corresponds to a quantity of data that is determined to be valid within the first group of memory cells, and
    the VTC for the second group of memory cells corresponds to a quantity of data that is determined to be valid within the second group of memory cells.

3. The method of claim 1, wherein performing the memory management operation involving the first group of memory cells and the second group of memory cells comprises consolidating valid data associated with a first memory block and valid data associated with a second memory block.

4. The method of claim 3, wherein the second group of memory cells is a group of memory cells that, prior to performance of the operation involving the first group of memory cells and the second group of memory cells, comprises a candidate block for an operation that is different from the memory management operation.

5. The method of claim 1, further comprising altering a destination block on which the memory management operation is performed in response to the operation involving the first group of memory cells and the second group of memory cells being performed.

6. An apparatus, comprising:
    a first group of memory cells;
    a second group of memory cells; and
    a processing device coupled to the first group of memory cells and the second group of memory cells, wherein the processing device is configured to:
        determine a valid translation count (VTC) for the first group of memory cells;
        determine a VTC for the second group of memory cells; and
        perform a memory management operation involving the first group of memory cells and the second group of memory cells in response to a consolidated VTC including the VTC for the first group of memory cells and the VTC for the second group of memory cells being equal to or exceeding a VTC threshold corresponding to performance of the memory management operation.

7. The apparatus of claim 6, wherein the processing device is further configured to:
    determine a memory management operation type corresponding to the memory management operation;
    determine a destination block for the memory management operation based on the first memory management operation type; and
    perform the memory management operation using the destination block.

8. The apparatus of claim 7, wherein the destination block is determined to be a low erase count rate destination block when the memory management operation type is a reliability fold and the destination block is determined to be a high erase count rate destination block when the memory management operation type is a time after programming (TAP) fold or a static wear leveling (SWL) fold.

9. The apparatus of claim 6, wherein the processing device is further configured to determine the VTC for the second group of memory cells in response to the VTC for the first group of memory cells being below the VTC threshold.

10. The apparatus of claim 6, wherein the memory management operation is a time after programming (TAP) fold or a static wear leveling (SWL) fold.

11. The apparatus of claim 10, wherein the VTC for the first group of memory cells corresponds to a VTC for a TAP fold candidate block and the VTC for the second group of memory cells corresponds to a VTC for a SWL fold candidate block.

12. The apparatus of claim 6, wherein the processing device is configured to perform the memory management operation utilizing only the first group of memory cells in response to the VTC corresponding to the first group of memory cells exceeding the VTC threshold.

13. A non-transitory computer-readable storage medium comprising instructions that, when executed by a processing device, cause the processing device to:
    in response to a determination that a first type of memory management operation is to be performed:
        identify a destination block having an erase count rate that meets an erase count rate criterion, and
        perform the first type of memory management operation using the destination block having the erase count rate that meets the erase count rate criterion;
    in response to a determination that a second type of memory management operation is to be performed:
        determine valid translation counts (VTCs) for candidate blocks for the second type of memory management operation, and
        perform the second type of memory management operation in response to the VTCs for the candidate blocks for the second type of memory management operation meeting a first VTC criterion; and
    in response to a determination that a third type of memory management operation is to be performed:
        determine valid translation counts (VTCs) for candidate blocks for the third type of memory management operation, and
        perform the third type of memory management operation in response to the VTCs for the candidate blocks for the third type of memory management operation meeting a second VTC criterion.

14. The medium of claim 13, wherein the first type of memory management operation is a reliability fold operation, the second type of memory management operation is a time after programming fold operation, and the third type of memory management operation is a wear leveling-based fold operation.

15. The medium of claim 13, further comprising instructions that, when executed by the processing device, cause the processing device to tag data corresponding to the VTC for candidate blocks for the second type of memory management operation and data corresponding to the VTC for candidate blocks for the third type of memory management operation as cold data when executing the second type of memory management operation.

16. The medium of claim 13, further comprising instructions that, when executed by the processing device, cause the processing device to identify the destination block having the erase count rate that meets the erase count rate criterion when the erase count rate for the destination block is below an erase count threshold.

17. The medium of claim 13, further comprising instructions that, when executed by the processing device, cause the processing device to perform the second type of memory management operation or perform the third type of memory management operation using a destination block that has an erase count rate that is above an erase count threshold.

18. The medium of claim 13, further comprising instructions that, when executed by the processing device, cause the processing device to perform the third type of memory management operation using the candidate blocks for the second type of memory management operation and the candidate blocks for the third type of memory management operation when a combination of the VTC for the candidate blocks for the third type of memory management meet a VTC criterion.

19. The medium of claim 13, further comprising instructions that, when executed by the processing device, cause the processing device to:
   determine a quantity of valid data written to the candidate blocks for the second type of memory management operation to determine the VTCs for the candidate blocks for the second type of memory management operation; and
   determine a quantity of valid data written to the candidate blocks for the third type of memory management operation to determine the VTCs for the candidate blocks for the third type of memory management operation.

* * * * *